(12) United States Patent
Wong

(10) Patent No.: US 7,053,671 B1
(45) Date of Patent: May 30, 2006

(54) LOW-JITTER DIFFERENTIAL-TO-SINGLE-ENDED DATA CONVERSION CIRCUITS

(75) Inventor: Wilson Wong, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 32 days.

(21) Appl. No.: 10/871,371

(22) Filed: Jun. 17, 2004

(51) Int. Cl.
 *H03K 5/22* (2006.01)

(52) U.S. Cl. ............................. 327/65; 327/66; 327/70; 327/89

(58) Field of Classification Search ...................... None
See application file for complete search history.

(56) References Cited

U.S. PATENT DOCUMENTS

| | | | | |
|---|---|---|---|---|
| 4,779,016 A | * | 10/1988 | Sugiyama et al. | 326/66 |
| 5,475,339 A | * | 12/1995 | Maida | 327/561 |
| 5,539,603 A | * | 7/1996 | Bingham | 361/56 |
| 5,701,102 A | * | 12/1997 | Kuo | 330/253 |
| 5,742,183 A | * | 4/1998 | Kuroda | 326/81 |
| 6,008,667 A | * | 12/1999 | Fahrenbruch | 326/66 |
| 6,236,269 B1 | * | 5/2001 | Hojabri | 330/253 |
| 6,344,758 B1 | | 2/2002 | Turner | 326/86 |
| 6,369,613 B1 | | 4/2002 | Costello | 326/83 |
| 6,429,735 B1 | * | 8/2002 | Kuo et al. | 327/563 |
| 6,433,579 B1 | | 8/2002 | Wang | 326/38 |
| 6,433,585 B1 | | 8/2002 | Patel | 326/83 |
| 6,604,228 B1 | | 8/2003 | Patel | 716/8 |
| 6,806,744 B1 | * | 10/2004 | Bell et al. | 327/70 |
| 2004/0145401 A1 | * | 7/2004 | Chiba et al. | 327/291 |

OTHER PUBLICATIONS

Ming-Ju Edward Lee, "An Efficient I/O and Clock Recovery Design for Terabit Integrated Circuits," Stanford PhD dissertation, Aug. 2001. pp. 1-112 and esp. p. 80.

* cited by examiner

*Primary Examiner*—Tuan T. Lam
(74) *Attorney, Agent, or Firm*—G. Victor Treyz

(57) ABSTRACT

Circuitry is provided for converting differential digital data to single-ended digital data. Differential data signals have complementary pairs of signals that are referenced to each other. Single-ended signals are referenced to ground. The circuitry can be used on an integrated circuit to convert incoming differential data from a high-speed communications link to single-ended data for processing by internal logic on the integrated circuit. The operation of the circuitry can be stabilized using load circuitry that reduces temperature effects and jitter in the single-ended data.

3 Claims, 9 Drawing Sheets

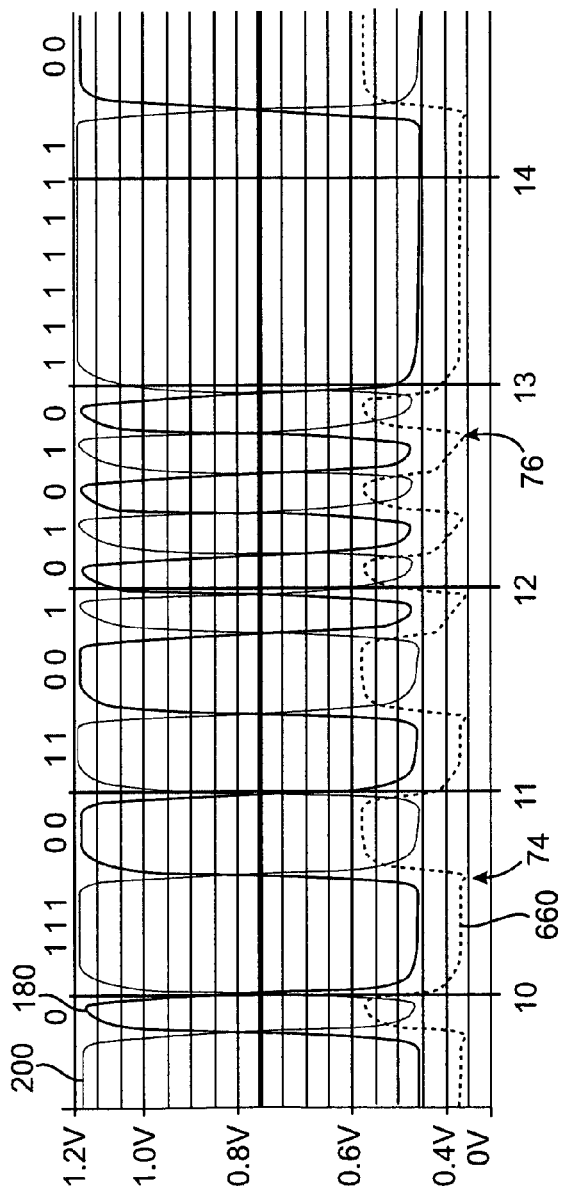
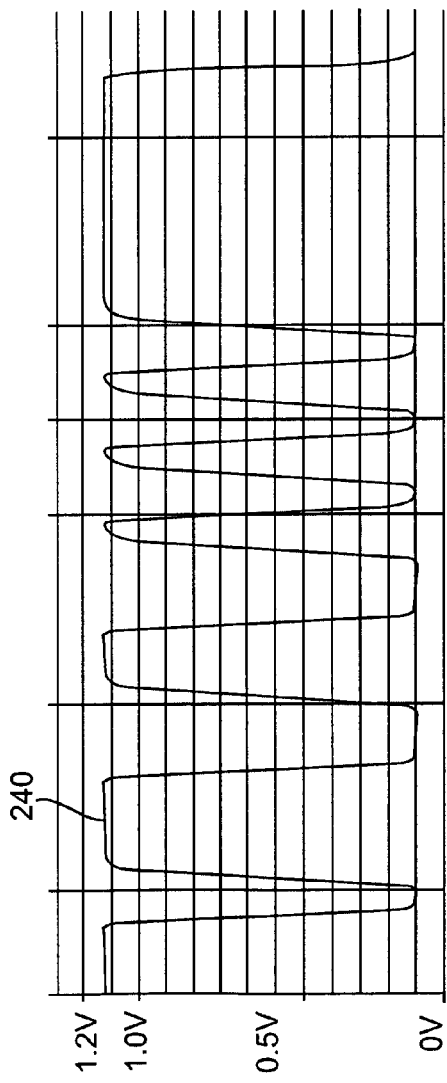

LOW-JITTER DIFFERENTIAL-TO-SINGLE-ENDED DATA CONVERSION CIRCUITS

BACKGROUND OF THE INVENTION

This invention relates to circuitry for converting differential data signals to single-ended data signals with low jitter.

Differential signaling arrangements are used in a variety of environments such as in high-speed communications links. Differential signaling arrangements are generally more immune to noise than single-ended signaling schemes and can support higher data rates. In a differential arrangement, data is conveyed as complementary positive and negative signals. The positive and negative complementary signals are referenced to each other. In single-ended signaling arrangements, the same data may be represented by a single signal that is referenced to ground.

Digital integrated circuits generally use single-ended logic schemes internally. When high-speed differential digital data is received from a high-speed differential communications link, it is necessary to use a conversion circuit to convert differential data to single-ended data.

As semiconductor fabrication technology advances, it is becoming possible to fabricate differential-to-single-ended conversion circuits from metal-oxide-semiconductor (MOS) transistors with increasingly short gate lengths. However, conventional differential-to-single-ended conversion circuits that are formed from MOS transistors with short gate lengths are sensitive to the run lengths of incoming data signals, which leads to excessive jitter.

It would therefore be desirable to be able to provide improved differential-to-single-ended conversion circuits.

SUMMARY OF THE INVENTION

Differential-to-single-ended conversion circuitry is provided that converts digital data that is represented as a pair of differential signals that are referenced to each other to a single-ended format in which signals are referenced to ground. Differential signaling schemes may be used to convey data over high-speed communications links. When differential data is received at an integrated circuit, the differential-to-single-ended conversion circuitry can be used to convert the differential data to single-ended data for processing by digital circuitry that is internal to the integrated circuit.

The differential-to-single-ended conversion circuitry may receive differential data signals at the gates of a pair of p-channel metal-oxide-semiconductor (PMOS) transistors. These transistors may be connected in series with a pair of respective n-channel metal-oxide-semiconductor (NMOS) transistors between a positive power supply and ground. The conversion circuit may have an output terminal that is connected to the source of one of the PMOS transistors and the drain of a respective one of the NMOS transistors.

The NMOS transistors may be connected to form a current mirror circuit. The gates of the NMOS transistors are connected to a node to which the source of one of the PMOS transistors is also connected. When that PMOS transistor is off during the processing of differential data signals (e.g., digital ones), leakage effects tend to lower the voltage at the node. The differential-to-single-ended conversion circuit has a load that is connected to this node. The load supplies a current that offsets the leakage effects and that stabilizes the voltage on the node. This stabilizes the current mirror and output signal against fluctuations due to run-length variations in the differential input data. The differential-to-single-ended conversion circuit exhibits low-jitter and high temperature stability.

Further features of the invention, its nature and various advantages will be more apparent from the accompanying drawings and the following detailed description of the preferred embodiments.

BRIEF DESCRIPTION OF THE DRAWINGS

FIGS. 6A and 6B are diagrams showing how the circuit of FIG. 5 converts differential signals to single-ended signals with low run-length sensitivity in accordance with the present invention.

DETAILED DESCRIPTION OF THE PREFERRED EMBODIMENTS

The present invention relates to circuitry for converting differential signals to single-ended signals for use on an integrated circuit. Differential signaling schemes use a pair of complementary signals that are referenced to each other. Differential signaling schemes are commonly used where high speed and good noise immunity are desired. For example, communications paths in a system backplane may use differential signaling.

Digital integrated circuits typically handle data internally in the form of single-ended signals. Single-ended signals are referenced to ground. If a single-ended signal has a high voltage (e.g., a voltage near a positive power supply voltage), that signal is said to be "high" (i.e., it represents a logic "1"). If a single-ended signal has a low voltage (e.g., a voltage near ground, that signal is said to be "low" (i.e., it represents a logic "0").

Differential-to-single-ended conversion circuitry (sometimes called level-shifting circuitry) is used to convert differential data that is received by a digital integrated circuit to single-ended data for use by the logic within the circuit.

Figure 1:
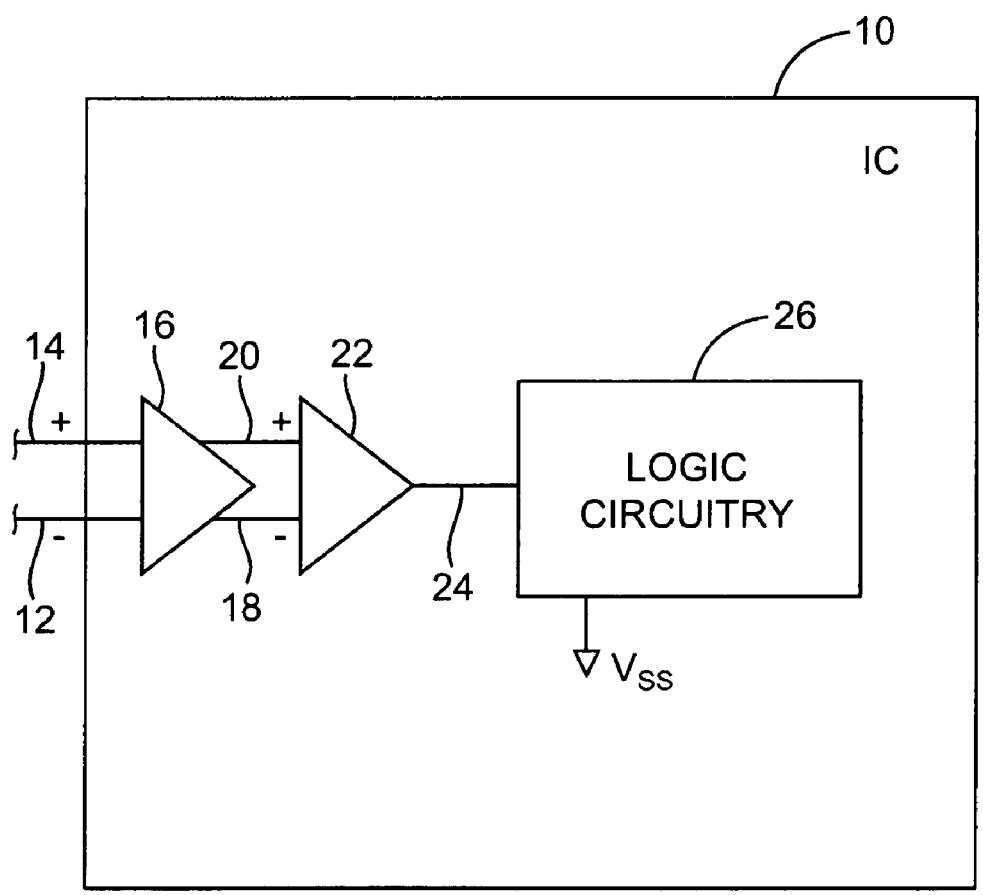
FIG. 1 is a diagram of an illustrative integrated circuit having a differential-to-single-ended conversion circuit in accordance with the present invention.

An integrated circuit 10 that is receiving differential data on a pair of differential signaling lines 12 and 14 is shown in FIG. 1. The differential lines are labeled "+" and "−" by convention and may be part of a communications path formed with another integrated circuit that is transmitting data to integrated circuit 10 in differential form. The signals on lines 12 and 14 are generally complementary (i.e., the signal on line 12 falls when the signal on line 14 rises and vice versa).

If desired, circuit 10 may have differential-to-differential buffer circuitry such as buffer circuitry 16 for buffering incoming differential signals. Buffer circuitry 16 may have unity gain or a small gain and may contain one or more buffer stages. Circuitry 16 can accept the signals on lines 12 and 14 as inputs and provide corresponding buffered differential output signals on lines 18 and 20.

Differential-to-single-ended conversion circuitry 22 receives the differential signals on lines 18 and 20 and converts them to corresponding single-ended signals on line 24. These single-ended signals are referenced to ground (Vss) and can be used by logic circuitry 26. Logic circuitry 26 may be any suitable circuitry that uses digital data such as logic circuitry on a programmable logic device, microprocessor, digital signal processing circuit, application-specific integrated circuit, etc.

In a typical arrangement, the differential signals on the input lines 12 and 14 range from about 100 mV to about 800 mV and the gain of buffer circuitry 16 ranges from about 1–5.

In the illustrative arrangement of FIG. 1, there is one buffer 16 and one associated differential-to-single-ended conversion circuit 22. In general, there may be multiple parallel differential communications paths connected to circuit 10. Each path may have its own associated differential input buffer circuitry 16 and associated differential-to-single-ended conversion circuitry 22. Single-ended-to-differential conversion circuitry may be used to drive differential signals from logic circuitry 26 off of circuit 10 if desired.

Figure 2:
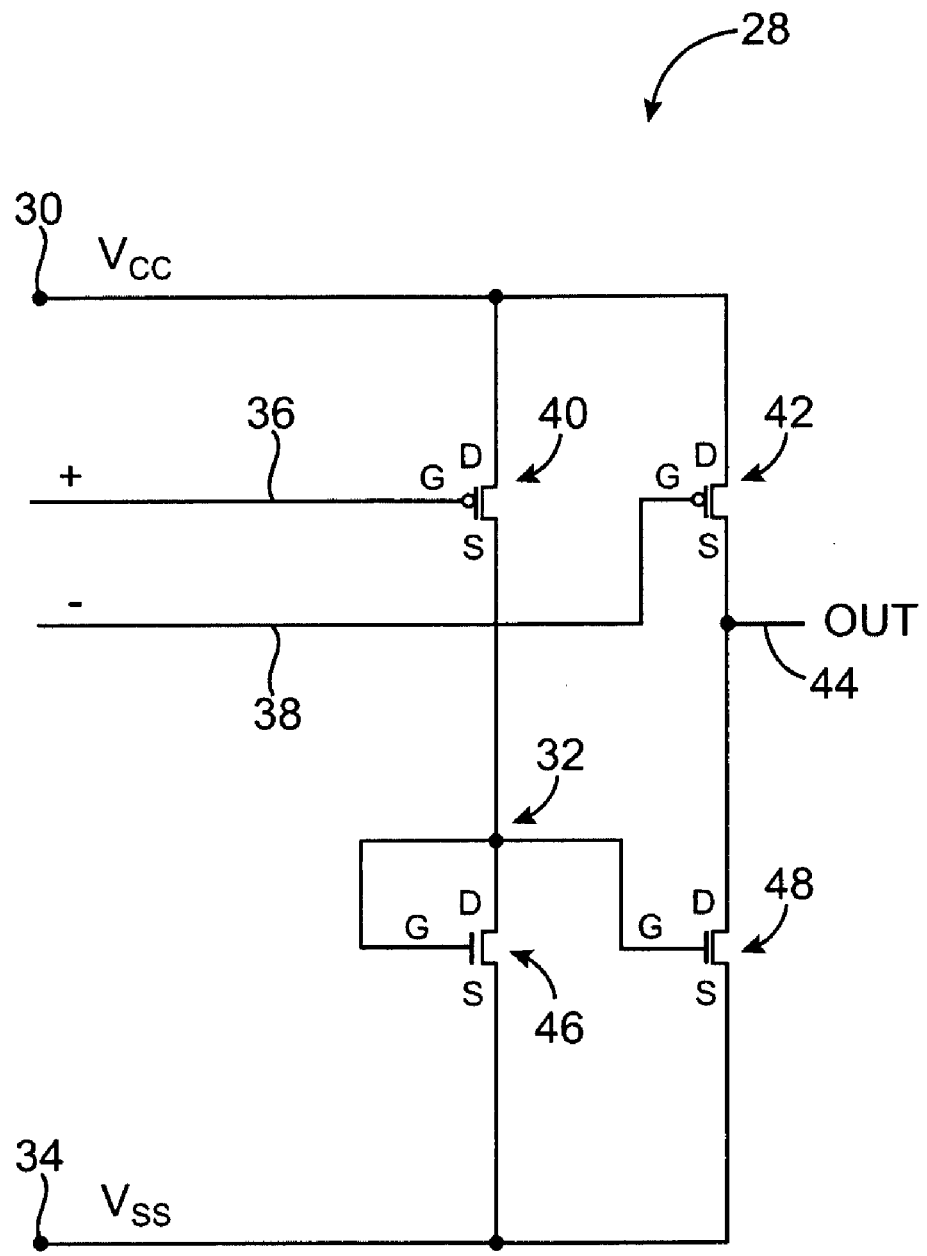
FIG. 2 is a circuit diagram of a conventional differential-to-single-ended conversion circuit.

A conventional differential-to-single-ended signal conversion circuit 28 is shown in FIG. 2. Node 30 is biased at a positive power supply voltage Vcc. Ground node 34 is biased at ground Vss. Complementary differential input signals are received on lines 36 and 38 (e.g., from a differential input buffer). Lines 36 and 38 are connected to the gates of p-channel MOS (PMOS) transistors 40 and 42 respectively. A current mirror circuit is formed by n-channel MOS (NMOS) transistors 46 and 48.

There are two possible input states, corresponding to a logic one or logic zero in the differential input data.

In the first situation a logic one is being received. The signal on line 36 is high and the signal on line 38 is low. This turns off transistor 40 and turns on transistor 42. In this situation, the drain-source resistance of transistor 42 is low, so the single-ended output signal at terminal 44 is connected to node 30 and the output signal at terminal 44 is taken high.

In the second situation, a logic zero is being received. The signal on line 36 is low and the signal on line 38 is high. This turns on transistor 40 and turns transistor 42 off. With the transistor 40 on, a drain-source current flows through transistor 46. Transistors 46 and 48 form a current mirror circuit, so the drain-source current flowing through transistor 46 is mirrored by the drain-source current of transistor 48. In this situation, transistor 48 is on and the resistance of transistor 48 is low. The output voltage at terminal 44 is therefore low (Vss).

In the current mirror circuit formed by transistors 46 and 48, the voltage on node 32 varies depending on the value of the input data. The voltage on node 32 is also dependent on the history of the input data. If numerous "ones" have been received, the voltage on node 32 will be different than if numerous "zeros" have been received or if only a single "one" has been received. This run-length dependence of the voltage on node 32 adversely affects the jitter of circuit 28 and the maximum bandwidth that circuit 28 can handle. The voltage on node 32 is also sensitive to temperature changes.

The performance of MOS transistors such as transistors 40 and 42 can be modeled using the well known relationship between gate-source voltage Vgs, threshold voltage Vt and drain-source current Ids for a MOS transistor, given in equation 1, where k is a constant.

$$Ids = 0.5k[Vgs-Vt]^2 \tag{1}$$

Solving for Vgs produces equation 2.

$$Vgs = [2Ids/k]^{1/2} + Vt \tag{2}$$

In the situation in which the data on lines 36 and 38 represents a logic one, transistor 40 is off, so the current Ids through transistor 46 is low. The value of the first term in equation 2 under these conditions is 0 volts. The value of a typical threshold voltage Vt for an MOS transistor produced with a modern MOS process is about 0.3 volts. Solving equation 2 gives a value of Vgs of about 0.3 volts.

In practice, there is non-negligible leakage current through transistor 46, which is exacerbated when a short gate length process is used to form transistor 46. As a result, the static charge on node 32 is discharged. The voltage on node 32 tracks the stored charge. If the discharge time is high, the voltage on node 32 can fall to extremely low values (e.g., values approaching Vss). If, however, the discharge time is low (e.g., because the incoming data switches state frequently), the voltage on node 32 will fall only slightly. The voltage on node 32 therefore depends on the run lengths (number of ones and zeros) of the incoming data. When incoming data has a large number of successive logic ones, the voltage on node 32 falls to a low value. When the incoming data has fewer ones in succession, the voltage on node 32 settles to a different value.

The node 32 is connected to the gate of transistor 48, so the voltage on node 32 controls transistor 48. The variability of the voltage on node 32 therefore influences the output voltage on line 44 and introduces jitter into the converted single-ended logic signals produced on line 44.

Figure 3A:
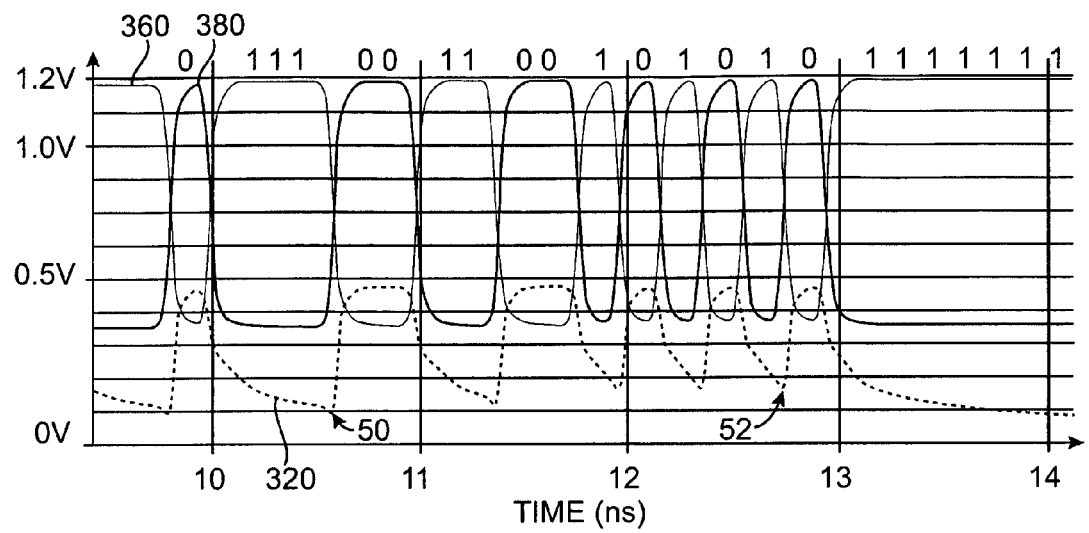
FIGS. 3A and 3B are diagrams showing how the conventional circuit of FIG. 2 is sensitive to variations in data run lengths.
Figure 3B:
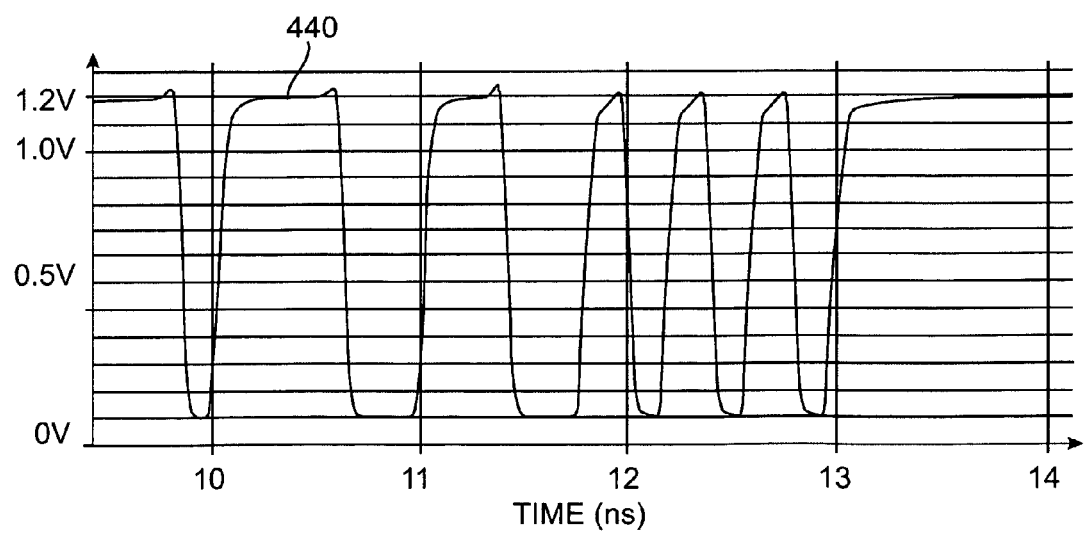
Figure 4:
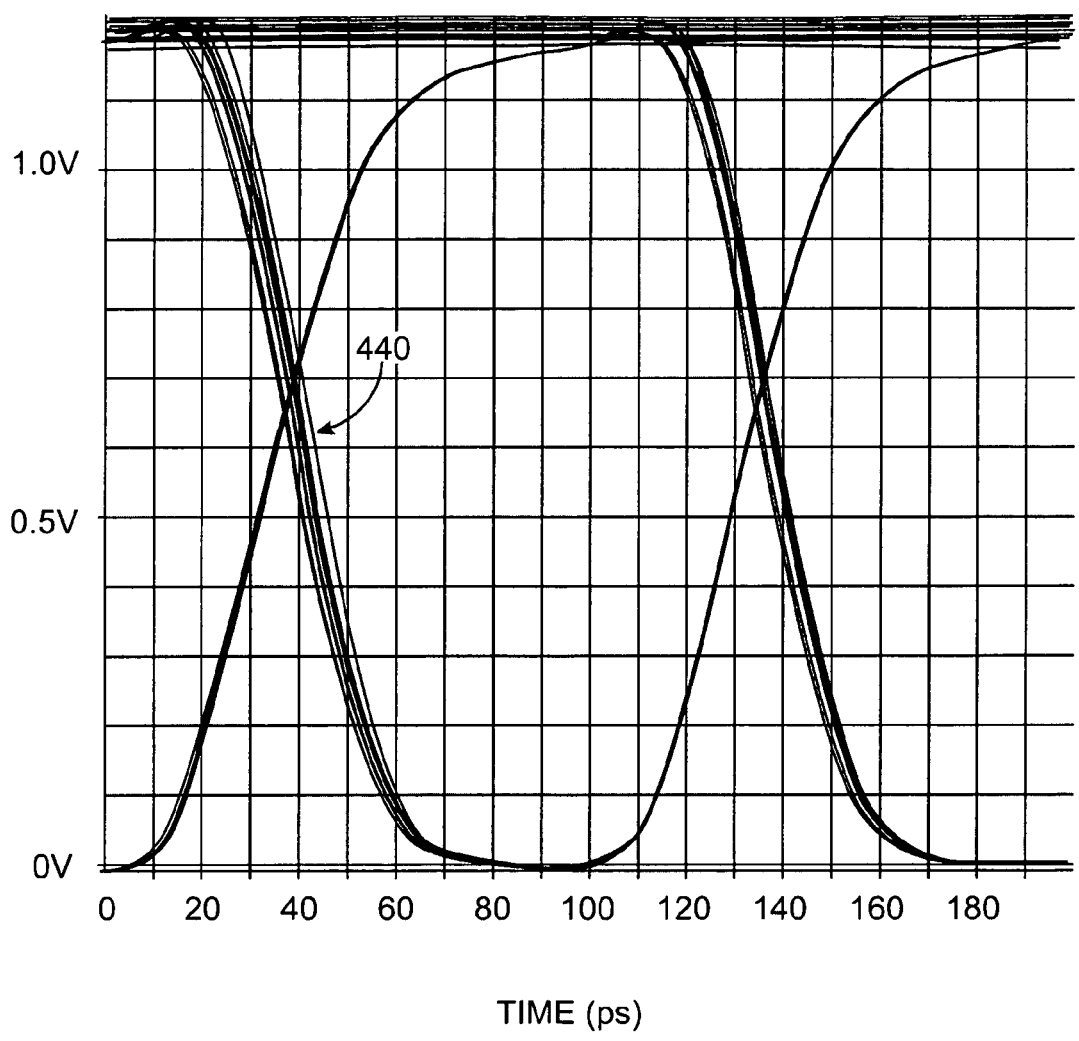
FIG. 4 is an eye diagram of the output of the conventional circuit of FIG. 2 showing how the circuit of FIG. 2 produces single-ended signals with substantial jitter.

The performance of the conventional differential-to-single-ended conversion circuitry 28 of FIG. 2 has been simulated to evaluate the effects of the leakage current through transistor 46. The results of this simulation are shown in FIGS. 3A, 3B, and 4. These results illustrate how the dependence of the voltage of node 32 on the run lengths of the differential input data on lines 36 and 38 produces jitter in the single-ended output produced on line 44 of the conventional conversion circuit 28 of FIG. 2.

In FIG. 3A, traces 360 and 380 represent the voltages of lines 36 and 38 of FIG. 2, respectively. Trace 320 is the voltage on node 32. FIG. 3B shows the corresponding single-ended output signal produced on output 44.

Above the traces 360 and 380, the graph of FIG. 3A has been annotated with "1s" and "0s" to show the value of the digital data being converted. The run length of the digital data varies, which affects the voltage 320 on node 32. For example, on the left of the graph, three "1s" appear in a row, which leads to a deep discharge of node 32 to a value at point 50 of about 100 mV. On the right of the graph, "1s" and "0s" alternate rapidly, so the leakage current of transistor 46 is unable to discharge the charge on node 32 as much. As a result, the voltage at point 52 on trace 320 only falls to about 160 mV. The variation in the value of the voltage on node 32 (from 100 to 160 mV) under different run-length conditions alters the output signal 440 (FIG. 3B), because the gate voltage of transistor 48 is changed by varying degrees.

The impact of the variability of the node 32 voltage on the output 440 is best shown in the eye diagram for output 440 that is presented in FIG. 4. As shown in FIG. 4, there is about a 5% jitter (variability) in the signal position (timing) for the output signal. This jitter will adversely affect the performance of any integrated circuit in which the conventional circuit 28 is used.

Figure 5:
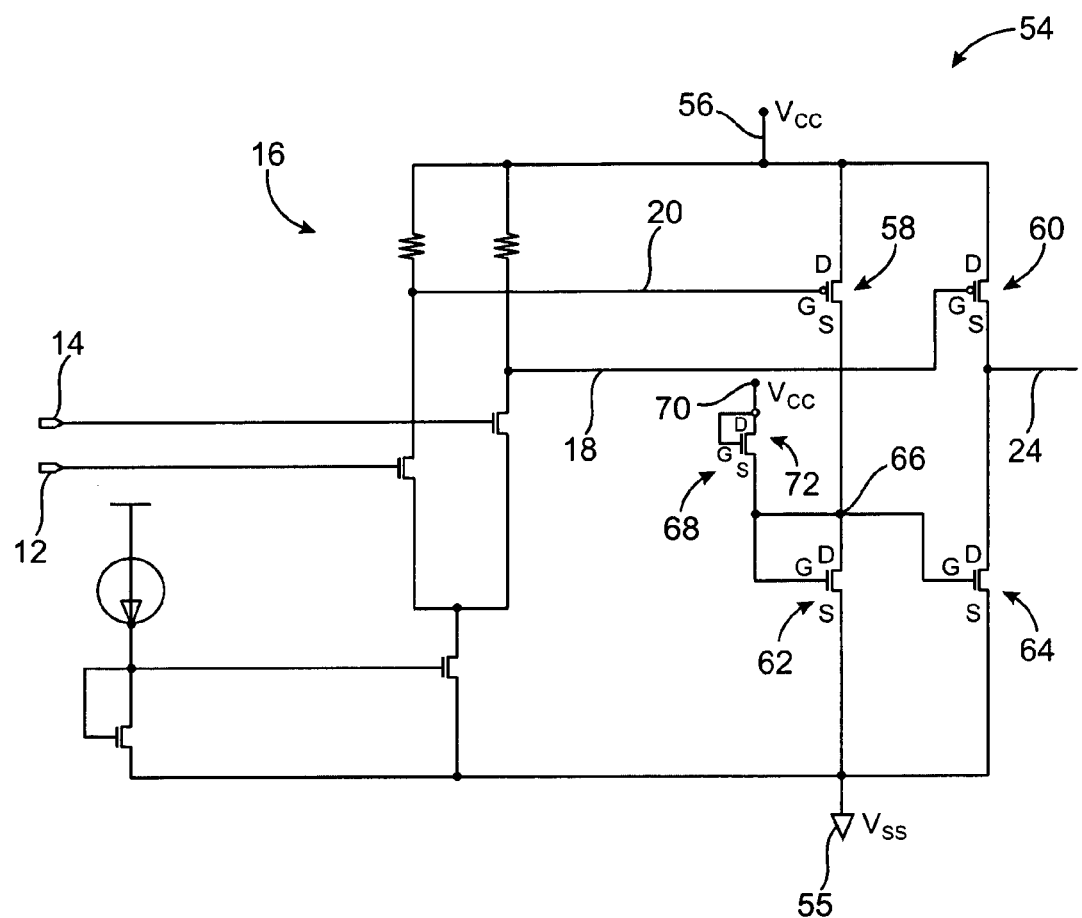
FIG. 5 is a circuit diagram of illustrative input circuitry including differential-to-single-ended conversion circuitry in accordance with the present invention.

Differential-to-single-ended conversion circuitry 54 in accordance with the present invention is shown in FIG. 5. Circuitry 54 may be used in the position shown by circuitry 22 of FIG. 1. The diagram of FIG. 5 also shows illustrative single-stage input buffer circuitry 16. Differential input signals may be received by the integrated circuit 10 in which circuitry 16 and 54 is installed on differential input lines 12 and 14. Circuitry 16 buffers these differential input signals and provides corresponding strengthened signals on lines 18 and 20. Lines 18 and 20 serve as differential inputs for differential-to-single-ended conversion circuitry 54.

In circuitry 54, node 56 is biased at a positive power supply voltage Vcc (e.g., a voltage of 1.2 volts). Ground node 55 is biased at ground Vss (e.g., a voltage of 0 volts). Complementary differential input signals are received on lines 18 and 20 from the output of differential input buffer 16. Lines 18 and 20 are connected respectively to the gates of p-channel MOS (PMOS) transistors 58 and 60. A current mirror circuit is formed by n-channel MOS (NMOS) transistors 62 and 64.

Circuit 54 converts data from differential form to single-ended form. Differential input data on lines 18 and 20 can represent either a logic one or a logic zero.

When a logic one is being received on lines 18 and 20, the signal on line 20 is high (near Vcc) and the signal on line 18 is low (about Vcc—700 mV as an example). This turns off transistor 58 and turns transistor 60 on. As a result, the drain-source resistance of transistor 60 is low, which electrically connects the single-ended output at line 24 to node 56. With line 24 connected to the positive power supply voltage Vcc, the output 24 of circuit 54 is high (Vcc). The output signal on output line 24 may be used as a logic one by internal digital circuitry 26 within the integrated circuit 10.

When a logic zero is being received on lines 18 and 20, the signal on line 20 is low (e.g., about Vcc—700 mV) and the signal on line 18 is high (near Vcc). This turns on transistor 58 and turns off transistor 60. With transistor 58 on, a drain-source current flows through transistor 62. Transistors 62 and 64 form a current mirror circuit, so the drain-source current flowing through transistor 62 is mirrored (replicated) by the drain-source current of transistor 64. In this situation, transistor 64 is on and the resistance of transistor 64 is low. The output voltage at terminal 24 is therefore low (Vss). This low signal may be used as a logic zero by logic circuitry 26 (FIG. 1).

In the conventional current mirror circuit formed by the transistor 46 and 48 of FIG. 2, node 32 floats and is highly influenced by the leakage current flowing through transistor 46 and the run lengths of incoming data. In contrast, the current mirror of transistor 62 and 64 uses a biasing circuit arrangement to help stabilize the voltage at node 66 to avoid dependence on the run lengths of the incoming data. The node 66 is connected to the gates (control terminals) of transistors 62 and 64.

The illustrative circuitry 68 of FIG. 5 that is used to stabilize node 66 is based on a load formed by an NMOS transistor 72. The gate of transistor 72 is connected to its drain, which is connected to positive power supply node 70 (Vcc). The source of transistor 72 is connected to node 66.

When a logic "one" is received on the differential inputs, transistor 58 turns off and transistor 60 turns on, taking output 24 high. Because transistor 58 is off, there is little current flowing through transistor 58. According to equation 2, the voltage at node 66 is therefore approximately 0.3 volts. As with the conventional differential-to-single-ended conversion circuitry 28 of FIG. 2, however, the charge on node 66 tends to be discharged by the non-negligible leakage current of transistor 62. (Transistor 62 may have a gate length of 90 nm or 65 nm or shorter.) However, unlike the conventional differential-to-single-ended conversion circuitry 28, the differential-to-single-ended conversion circuitry 54 of FIG. 5 has a circuit 68 that helps to counteract the discharging of the charge on node 66 when transistor 58 is off.

Circuit 68 counteracts the leakage of transistor 62 by producing current that charges node 66 whenever node 66 starts to discharge. If the leakage current of transistor 62 starts to discharge the charge at node 66, the voltage at node 66 will start to drop. This lowers the voltage of the source (S) of transistor 72 and increases the gate-source voltage Vgs of transistor 72. When the value of Vgs for transistor 72 increases, the current flowing through transistor 72 increases. This, in turn, counteracts the leakage current of transistor 62 and cause the voltage of node 66 to rise. Similarly, if the leakage current of transistor 62 is insufficient to overwhelm the charging current produced by transistor 72, the charge and voltage at node 66 will start to rise. As a result, the value of Vgs for transistor 72 will decrease, thereby decreasing the drain-source current of transistor 72.

The load formed by transistor 72 therefore works with transistor 62 to set the operating point of the transistor 62 when the transistor 58 is off. The voltage on node 66 is not allowed to drop too far or rise to much. Because the voltage on node 66 is now bounded on the lower end, the voltage on node 66 cannot drop to Vss, even if data with a very large number of successive ones is received. This improves the bandwidth of circuit 54, because node 66 and the connected gate of transistor 64 do not need to recover from deep discharge conditions when data of long run lengths is encountered. Jitter is also improved by the reduction of variability of the voltage of node 66.

Figure 7:
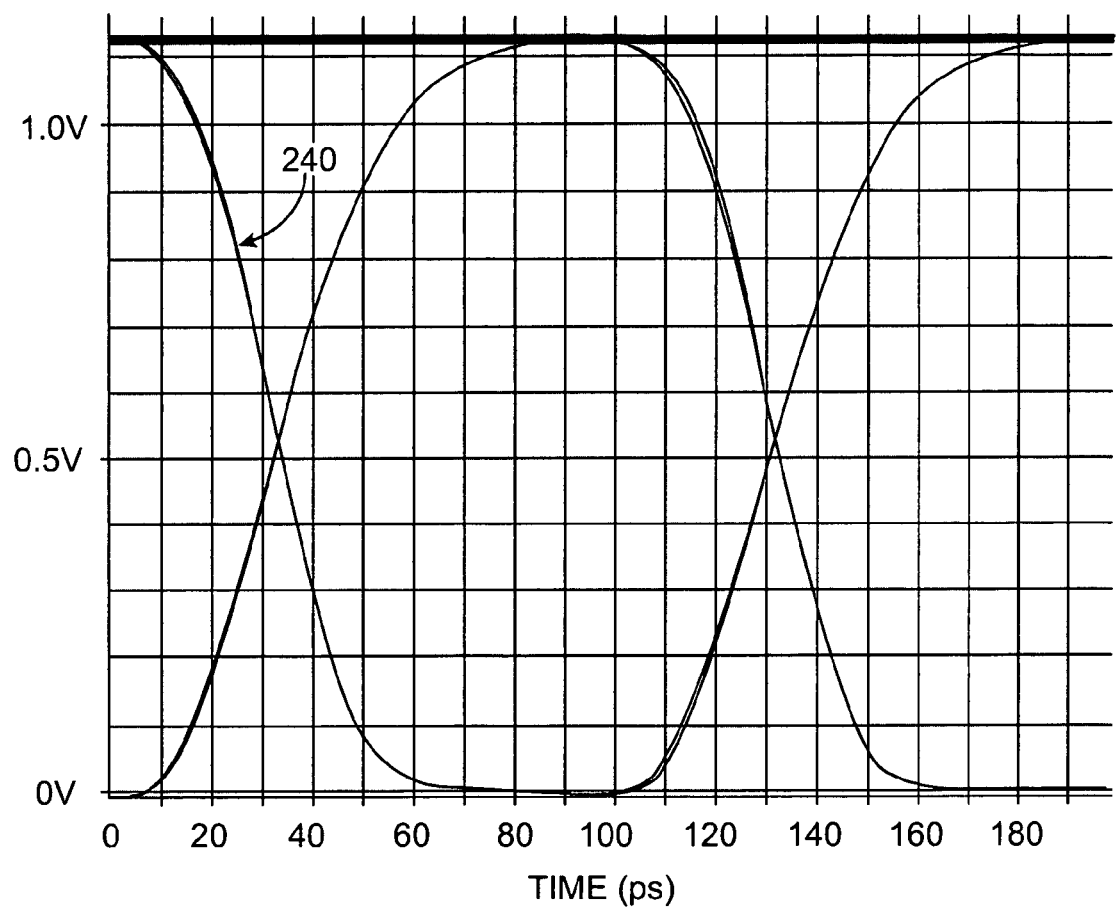
FIG. 7 is an eye diagram of the output of the circuit of FIG. 5 showing how the circuit of FIG. 5 produces single-ended signals with low jitter in accordance with the present invention.

The performance of the differential-to-single-ended conversion circuitry 54 of FIG. 5 has been simulated to evaluate the impact of stabilizing the voltage on node 66 using the load of circuit 68. The results of this simulation are shown in FIGS. 6A, 6B, and 7. These results illustrate how the load of circuit 68 essentially eliminates any dependence of the lower limit of the voltage of node 66 on the run length of the differential input data on lines 18 and 20. Jitter in the output signal on output 24 is also reduced or eliminated.

In FIG. 6A, traces 200 and 180 represent the voltages of lines 20 and 18 of FIG. 5, respectively. Trace 660 represents the voltage on node 66. FIG. 6B shows the corresponding single-ended output signal 240 produced on output 24. If desired, this output signal may be strengthened by driver circuitry following output 24 (not shown in FIG. 5).

Above the traces 200 and 180, the graph of FIG. 6A has been annotated with "1s" and "0s" to show the value of the differential digital data being converted to single-ended data. The run lengths of the ones and zeros in the digital data varies, which affects the discharge level of the voltage 320 on node 32 in conventional differential-to-single-ended conversion circuitry of the type shown in FIG. 2, but which does not significantly affect the discharge level of voltage 660 on node 66 of FIG. 5.

The stability of the circuitry of FIG. 5 under incoming data streams with various run lengths is illustrated by the response of the node 66 voltage (trace 660). On the left of the graph of FIG. 6A, three ones appear in a row across inputs 20 and 18, as shown by traces 200 and 180. In response, the voltage 660 drops to about 360 mV at point 74.

On the right of the graph, ones and zeros alternate one after the other. In the conventional circuit 28 of FIG. 2, the leakage current of transistor 46 was unable to discharge the charge on node 32 in the short amount of time between each alternation between a one and zero as much as the charge on node 32 was discharged following three ones (see point 50 in the conventional response of FIG. 3A). In the conventional circuit 28, this led to a reduced discharge at point 52 (FIG. 3A). In contrast, as shown at point 76 of FIG. 6A, the load 68 of FIG. 5 stabilizes the voltage at node 66 in the circuit 54 of the present invention. The voltage 660 at point 76 falls to about the same level (360 mV in this example) as the voltage 660 fell at point 74. This demonstrates that the lower limit of the voltage 660 on node 66 has been stabilized by the presence of the load circuitry 68. The upper limit of the voltage 660 is not affected by leakage current effects.

Because the minimum and maximum values of the voltage on node 66 do not vary significantly under different run-length conditions, the gate voltages of transistor 64 do not fluctuate in response to changes in run length as would occur with conventional circuits of the type shown in FIG. 2. This reduces jitter in the output 24.

The impact of the stabilization of the voltage at node 66 on the output 24 is shown in the eye diagram for output signal 240 that is presented in FIG. 7. As shown in FIG. 7, the jitter in the signal position for the output signal 240 is essentially eliminated. Each trace of the eye diagram lies exactly on top of a previous trace, indicating that the timing characteristics of the output signal 240 are stable. This improves the performance of logic circuitry 26 (FIG. 1) and circuit 10.

Figure 8A:
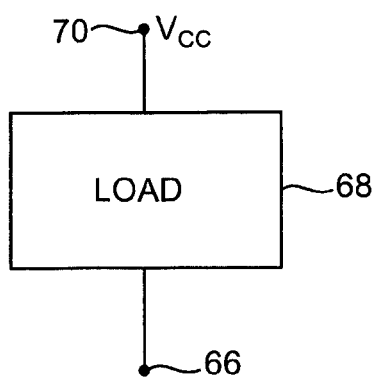
FIG. 8A is a diagram of an illustrative load circuit that may be used to stabilize the performance of differential-to-single-ended conversion circuits in accordance with the present invention.

In the example of FIG. 5, the current mirror circuit formed using transistors 62 and 64 is provided with a load circuit formed from an NMOS transistor with its gate tied to its drain. A benefit of this type of arrangement is that the NMOS transistor 72 consumes a relatively small amount of real estate on the chip and provides good performance. This is, however, merely one illustrative type of load that may be used. Any suitable load 68 may be used between node 70 and node 66, as shown in FIG. 8A.

Figure 8B:
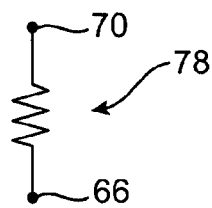
FIG. 8B is a diagram of an illustrative load circuit based on a resistor that may be used to stabilize the performance of differential-to-single-ended conversion circuits in accordance with the present invention.

For example, as shown in FIG. 8B, the load for the current mirror may be based on a resistor 78 that is connected between Vcc at node 70 and node 66. The resistor 78 may be a polysilicon resistor, a diffused resistor in the semiconductor substrate of integrated circuit 10, or any other suitable resistor.

Figure 8C:
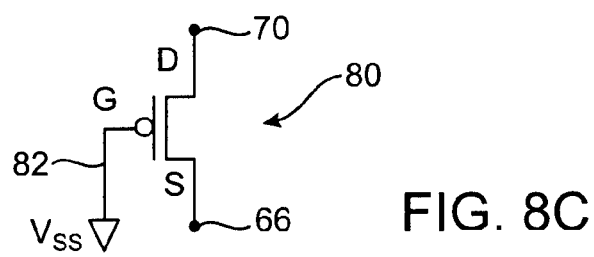
FIG. 8C is a diagram of an illustrative load circuit based on a p-channel metal-oxide-semiconductor transistor with a grounded gate that may be used to stabilize the performance of differential-to-single-ended conversion circuits in accordance with the present invention

Load 68 may also be based on a PMOS transistor. In the illustrative arrangement of FIG. 8C, PMOS transistor 80 has its drain connected to node 70 at Vcc and its source connected to node 66. The gate G of PMOS transistor 80 is grounded at Vss using path 82. To ensure that transistor 80 has a sufficiently large resistance at a gate voltage of 0 volts (Vss), the transistor 80 should be made weak by using a long value of gate length for its gate. Care should be taken to avoid making the size of transistor 80 too large, so that the capacitance on the drain of transistor 80 does not excessively slow down the process of charging and discharging node 66.

Figure 8D:
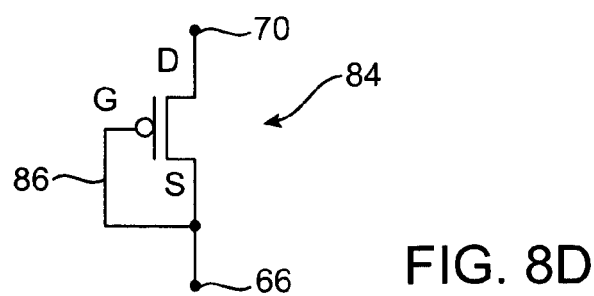
FIG. 8D is a diagram of an illustrative load circuit based on a p-channel metal-oxide-semiconductor transistor with its gate tied to its source that may be used to stabilize the performance of differential-to-single-ended conversion circuits in accordance with the present invention

In the illustrative arrangement of FIG. 8D, load 68 is formed from a PMOS transistor 84 connected between node 70 and node 66. Transistor 84 has its gate connected to node 66 by path 86. This type of arrangement generally has a higher gate voltage than the arrangement of FIG. 8C (in which the gate is grounded), so the transistor 84 need not have as large a gate length to weaken its performance and increase its resistance. This helps reduce the capacitance from the gate of transistor 84, which might otherwise tend to slow the charging and discharging of node 66 too much.

An advantage of using load 68 to stabilize the performance of differential-to-single-ended conversion circuitry 54 against the effects of data run-length variations is that increased stabilization reduces temperature-induced variations in performance.

Figure 9:
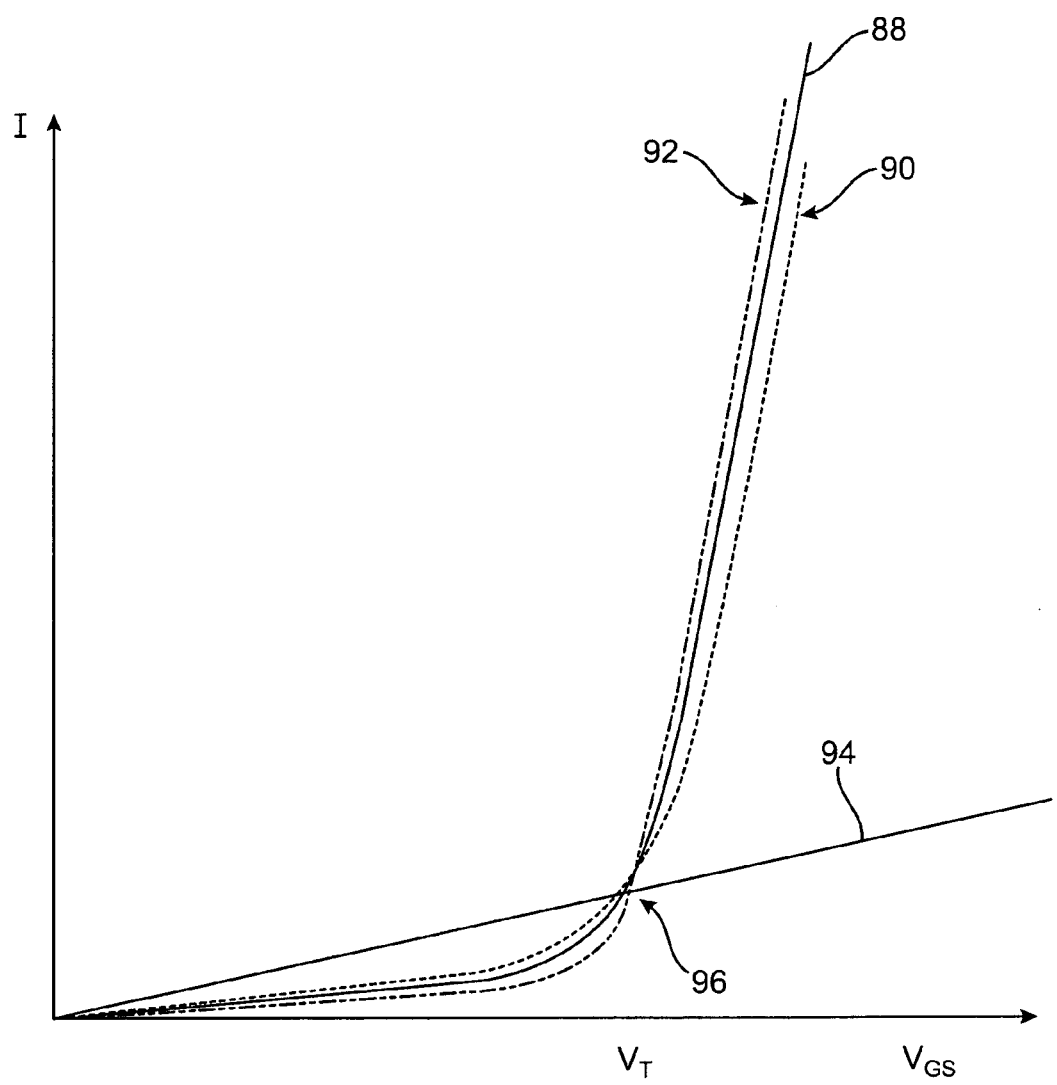
FIG. 9 is a graph illustrating the stability of the differential-to-single-ended conversion circuitry under various temperature conditions in accordance with the present invention.

The improved temperature stability of circuitry 54 can be understood with reference to the graph of FIG. 9. The line 88 shows the current flowing through transistor 62 as a function of the gate-source voltage Vgs of transistor 62. When the temperature of transistor 62 increases, the current-voltage characteristic of transistor 62 is represented by line 90. When the temperature of transistor 62 decreases, the current-voltage characteristic of transistor 62 is as given by line 92.

When a "one" is presented on lines 18 and 20, transistor 62 operates where the load line 94 of FIG. 9 (which, in this example corresponds to a resistive load 68 of the type shown in FIG. 8B) intersects curve 88. The load 68 is preferably selected so that the load line 94 intersects curve 88 just below threshold (Vt). As shown by the small variation in the locations of the intersection points 96 between the curves 88, 90, and 92 and the load line 94, the node voltage 66 (Vgs) does not vary significantly, even as the operating temperature of circuitry 54 varies. With conventional differential-to-single-ended conversion circuitry of the type shown in FIG. 2, there is no load (i.e., the load line would be a flat line along the x-axis of FIG. 9), so when transistor 40 of FIG. 2 is off, the transistor 46 could discharge to an arbitrarily low value of Vgs. In contrast, the load line 94 sets a lower limit on Vgs, which stabilizes Vgs when circuit 54 is converting a differential "one" into a single-ended "one." With a stable Vgs and therefore a stable value of the voltage on node 66 and the gate of transistor 64 in circuitry 54 of FIG. 5, the circuitry 54 produces low-jitter and temperature-insensitive single-ended output signals at output 24.

The foregoing is merely illustrative of the principles of this invention and various modifications can be made by those skilled in the art without departing from the scope and spirit of the invention.

What is claimed is:

1. Differential-to-single-ended conversion circuitry that converts digital data that is represented as first and second complementary differential input signals to a single-ended signal that is referenced to ground, comprising:
- a positive power supply voltage terminal;
- a ground power supply voltage terminal;
- first, second, third, and fourth transistors each having a drain, source, and gate;
- a load having first and second terminals, wherein the first terminal of the load is connected to the positive power supply voltage terminal; and
- an output terminal at which the single-ended signal is provided, wherein:
  - the gates of the first and second transistors respectively receive the first and second differential input data signals;
  - the drains of the first and second transistors are connected to the positive power supply voltage terminal;
  - the drains of the third and fourth transistors are respectively connected to the sources of the first and second transistors;
  - the drain of the fourth transistor and the source of the second transistor are connected to the output terminal;
  - the sources of the third and fourth transistors are connected to the ground power supply voltage terminal;
  - the gates of the third and fourth transistors are connected to the drain of the third transistor and the source of the first transistor; and
  - the second terminal of the load is connected to the gates of the third and fourth transistors, wherein the first and second transistors comprise p-channel metal-oxide-semiconductor transistors, wherein the third and fourth transistors comprise n-channel metal-oxide-semiconductor transistors, and wherein the load comprises an n-channel transistor having a gate and drain connected to the positive power supply voltage terminal and a source connected to the gates of the third and fourth transistors.

2. Differential-to-single-ended conversion circuitry that converts digital data that is represented as first and second complementary differential input signals to a single-ended signal that is referenced to ground, comprising:
- a positive power supply voltage terminal;
- a ground power supply voltage terminal;
- first, second, third, and fourth transistors each having a drain, source, and gate;
- a load having first and second terminals, wherein the first terminal of the load is connected to the positive power supply voltage terminal; and
- an output terminal at which the single-ended signal is provided, wherein:
  - the gates of the first and second transistors respectively receive the first and second differential input data signals;
  - the drains of the first and second transistors are connected to the positive power supply voltage terminal;
  - the drains of the third and fourth transistors are respectively connected to the sources of the first and second transistors;
  - the drain of the fourth transistor and the source of the second transistor are connected to the output terminal;
  - the sources of the third and fourth transistors are connected to the ground power supply voltage terminal;
  - the gates of the third and fourth transistors are connected to the drain of the third transistor and the source of the first transistor; and
  - the second terminal of the load is connected to the gates of the third and fourth transistors, wherein the first and second transistors comprise p-channel metal-oxide-semiconductor transistors, wherein the third and fourth transistors comprise n-channel metal-oxide-semiconductor transistors, and wherein the load comprises a p-channel transistor having a gate connected to the ground power supply voltage terminal, having a drain connected to the positive power supply voltage terminal, and having a source connected to the gates of the third and fourth transistors.

3. Differential-to-single-ended conversion circuitry that converts digital data that is represented as first and second complementary differential input signals to a single-ended signal that is referenced to ground, comprising:
- a positive power supply voltage terminal;
- a ground power supply voltage terminal;
- first, second, third, and fourth transistors each having a drain, source, and gate;
- a load having first and second terminals, wherein the first terminal of the load is connected to the positive power supply voltage terminal; and
- an output terminal at which the single-ended signal is provided, wherein:
  - the gates of the first and second transistors respectively receive the first and second differential input data signals;
  - the drains of the first and second transistors are connected to the positive power supply voltage terminal;
  - the drains of the third and fourth transistors are respectively connected to the sources of the first and second transistors;
  - the drain of the fourth transistor and the source of the second transistor are connected to the output terminal;
  - the sources of the third and fourth transistors are connected to the ground power supply voltage terminal;
  - the gates of the third and fourth transistors are connected to the drain of the third transistor and the source of the first transistor; and
  - the second terminal of the load is connected to the gates of the third and fourth transistors, wherein the first and second transistors comprise p-channel metal-oxide-semiconductor transistors, wherein the third and fourth transistors comprise n-channel metal-oxide-semiconductor transistors, and wherein the load comprises a p-channel transistor having a gate and source connected to the gates of the third and fourth transistors and having a drain connected to the positive power supply voltage terminal.

* * * * *